United States Patent
Farber et al.

(10) Patent No.: US 9,224,657 B2
(45) Date of Patent: Dec. 29, 2015

(54) HARD MASK FOR SOURCE/DRAIN EPITAXY CONTROL

(71) Applicant: Texas Instruments Incorporated, Dallas, TX (US)

(72) Inventors: David Gerald Farber, Plano, TX (US); Tom Lii, Plano, TX (US); Brian K. Kirkpatrick, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 28 days.

(21) Appl. No.: 13/960,517

(22) Filed: Aug. 6, 2013

(65) Prior Publication Data

US 2015/0044830 A1 Feb. 12, 2015

(51) Int. Cl.
*H01L 21/8238* (2006.01)

(52) U.S. Cl.
CPC *H01L 21/823814* (2013.01); *H01L 21/823807* (2013.01)

(58) Field of Classification Search
CPC ... H01L 21/8238; H01L 21/336; H01L 27/01; H01L 31/112; H01L 31/336; H01L 29/76; H01L 29/78
USPC ............ 257/369, E21.632, E21.24, E29.255; 438/200, 231, 763
See application file for complete search history.

(56) References Cited

U.S. PATENT DOCUMENTS

| | | |
|---|---|---|
| 5,536,360 A | 7/1996 | Nguyen |
| 2008/0079087 A1* | 4/2008 | Nam et al. ..................... 257/369 |
| 2011/0070703 A1* | 3/2011 | Xiong et al. .................. 438/231 |

OTHER PUBLICATIONS

Xia, et al., Novel Hardmask for Sub-20nm Copper/Low K Backend Dual Damascene Integration, ECS Trans. 2011, vol. 35, Issue 4, pp. 651-665.
Cote, et al., High Selectivity Magnetically Enhanced Reactive Ion Etching of Boron Nitride Films, J. Electrochem. Soc., vol. 141, No. 12, Dec. 1994.
Maeda, et al., Low Dielectric Constant Amorphous SiBN Ternary Films Prepared by Plasma-Enhanced Deposition, Japanese Journal of Applied Physics, vol. 26, No. 5, May, 1987, pp. 660-665.
Kim, et al., A Highly Manufacturable Low4 ALD-SiBN Process for 60nm NAND Flash Devices and Beyond, IEDM 04-1063.

* cited by examiner

*Primary Examiner* — Fernando L Toledo
*Assistant Examiner* — Lawrence-Linh T Nguyen
(74) *Attorney, Agent, or Firm* — Jacqueline J. Garner; Frank D. Cimino

(57) ABSTRACT

An integrated circuit is formed to include a first polarity MOS transistor and a second, opposite, polarity MOS transistor. A hard mask of silicon-doped boron nitride ($Si_xBN$) with 1 atomic percent to 30 atomic percent silicon is formed over the first polarity MOS transistor and the second polarity MOS transistor. The hard mask is removed from source/drain regions of the first polarity MOS transistor and left in place over the second polarity MOS transistor. Semiconductor material is epitaxially grown at the source/drain regions of the first polarity MOS transistor while the hard mask is in place. Subsequently, the hard mask is removed from the second polarity MOS transistor.

19 Claims, 18 Drawing Sheets

HARD MASK FOR SOURCE/DRAIN EPITAXY CONTROL

FIELD OF THE INVENTION

This invention relates to the field of integrated circuits. More particularly, this invention relates to metal oxide semiconductor (MOS) transistors in integrated circuits.

BACKGROUND OF THE INVENTION

An integrated circuit may be formed by growing epitaxial semiconductor material in source/drain regions of one polarity of MOS transistor. The epitaxially grown material may be blocked from an opposite polarity MOS transistor by a hard mask of dielectric material. Patterning the hard mask prior to the epitaxial growth and removing the hard mask after the epitaxial growth without damaging or consuming underlying layers may be problematic. Maintaining a desired consistency of spacing between the epitaxial semiconductor material in source/drain regions of a transistor may also be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed to include a first polarity MOS transistor and a second, opposite, polarity MOS transistor. A hard mask of silicon-doped boron nitride ($Si_xBN$) with at least 1 atomic percent silicon is formed over the first polarity MOS transistor and the second polarity MOS transistor. The hard mask is removed from source/drain regions of the first polarity MOS transistor and left in place over the second polarity MOS transistor. Semiconductor material is epitaxially grown at the source/drain regions of the first polarity MOS transistor while the hard mask is in place. Subsequently, the hard mask is removed from the second polarity MOS transistor.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit is formed to include a first polarity MOS transistor and a second, opposite, polarity MOS transistor. A hard mask of silicon-doped boron nitride ($Si_xBN$) with 1 atomic percent to 30 atomic percent silicon is formed over the first polarity MOS transistor and the second polarity MOS transistor. For the purposes of this disclosure, the term $Si_xBN$ denotes silicon-doped boron nitride with an atomic fraction x of silicon. The hard mask is removed from source/drain regions of the first polarity MOS transistor and left in place over the second polarity MOS transistor. Having at least 1 atomic percent silicon in the $Si_xBN$ hard mask provides better etch selectivity to underlying materials such as silicon and silicon dioxide compared to silicon-free boron nitride. Semiconductor material is epitaxially grown at the source/drain regions of the first polarity MOS transistor while the hard mask is in place. Subsequently, the hard mask is removed from the second polarity MOS transistor. Having less than 30 atomic percent silicon in the $Si_xBN$ hard mask desirably inhibits epitaxial growth of the semiconductor material on the hard mask. The hard mask may be left on sidewalls of the first polarity MOS transistor to form epitaxial spacers during the epitaxial growth process. Alternatively, the hard mask may be removed from sidewalls of the first polarity MOS transistor. The source/drain regions of the first polarity MOS transistor may be etched to form source/drain cavities prior to the epitaxial growth process, so that the epitaxial semiconductor material extends into a substrate of the integrated circuit proximate to a gate of the first polarity MOS transistor. Alternatively, the epitaxial semiconductor material may be grown above the top surface of the substrate.

Figure 1A:
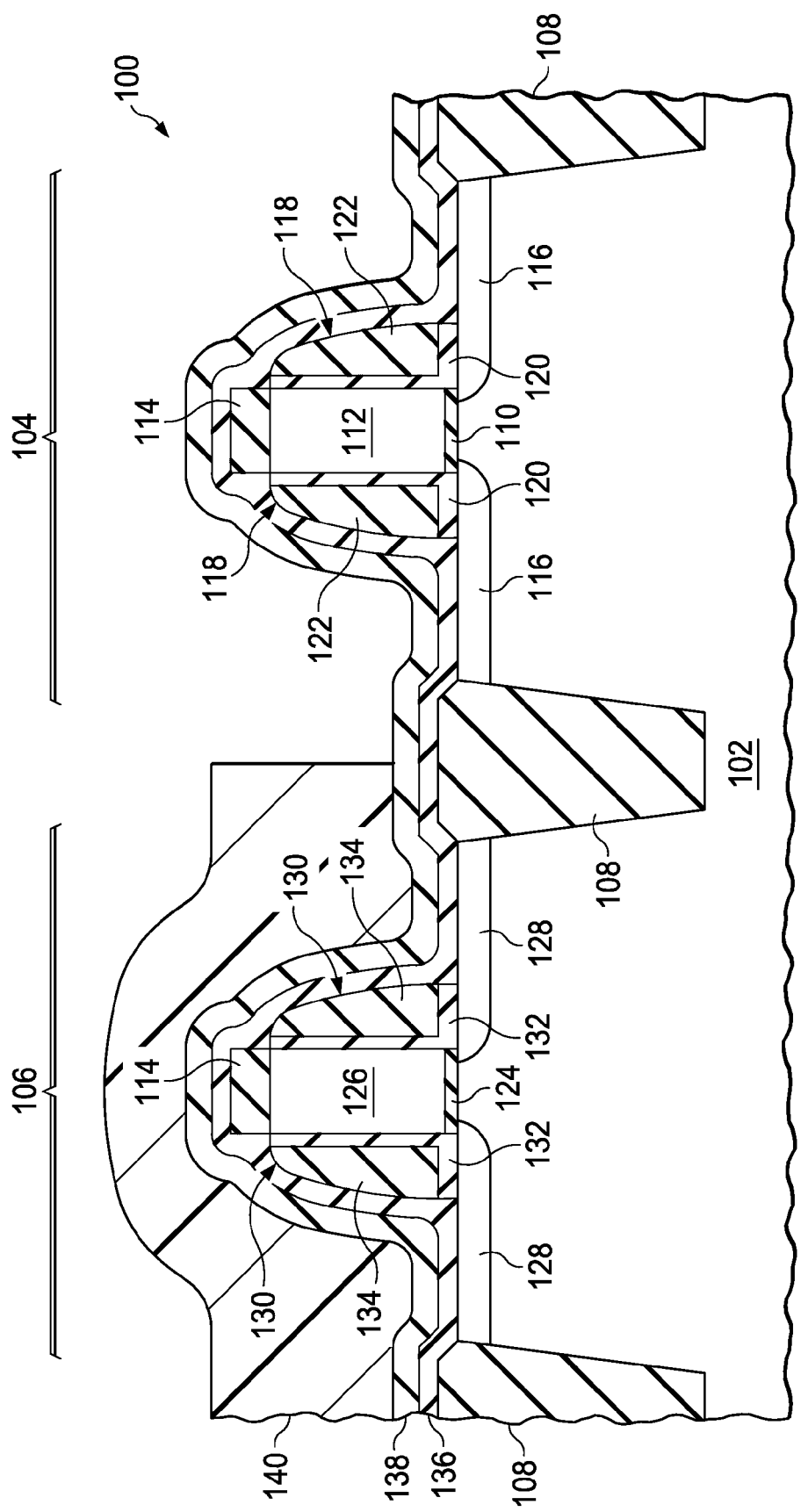
FIG. 1A through FIG. 1H are cross sections of an integrated circuit, depicted in successive stages of an exemplary fabrication sequence.

FIG. 1A through FIG. 1H are cross sections of an integrated circuit, depicted in successive stages of an exemplary fabrication sequence. Referring to FIG. 1A, the integrated circuit 100 is formed in and on a substrate 102 which includes semiconductor material. The substrate 102 may be, for example, a single crystal silicon wafer, a silicon-on-insulator (SOI) wafer, a hybrid orientation technology (HOT) wafer with regions of different crystal orientations, or other material appropriate for fabrication of the integrated circuit 100. The integrated circuit 100 includes an area for a first polarity MOS transistor 104 which in the instant example is a p-channel metal oxide semiconductor (PMOS) transistor 104, and a second, opposite polarity MOS transistor 106 which in the instant example is an n-channel metal oxide semiconductor (NMOS) transistor 106. The PMOS transistor 104 and the NMOS transistor 106 may be laterally isolated by field oxide 108 at a top surface of the substrate 102. The field oxide 108 may be formed, for example, by a shallow trench isolation (STI) process.

The PMOS transistor 104 includes a first gate dielectric layer 110 formed at the top surface of substrate 102 and a first gate 112 formed over the first gate dielectric layer 110. The first gate dielectric layer 110 and the first gate 112 may be sacrificial elements of thermally grown silicon dioxide and polycrystalline silicon, respectively, which will be replaced by a high-k gate dielectric layer and a metal gate later in the fabrication sequence. Alternatively, the first gate dielectric layer 110 and the first gate 112 may be permanent elements of the PMOS transistor 104. Gate hard mask material 114 may possibly be present over the first gate 112. The PMOS transistor 104 also includes p-type lightly doped drain (PLDD) regions 116 formed in the substrate 102 adjacent to, and underlapping, the first gate 112. The PMOS transistor 104 further includes first source/drain (S/D) spacers 118 on lateral surfaces of the first gate 112. The first S/D spacers 118 may include, for example, a first spacer layer 120 of silicon dioxide and a second spacer layer 122 of silicon nitride. Other configurations of the first S/D spacers 118, for example additional layers of silicon dioxide and/or silicon nitride, are within the scope of the instant example. At least a portion of the first S/D spacers 118, for example the second spacer layer 122, are formed after the PLDD regions 116.

Similarly, the NMOS transistor 106 includes a second gate dielectric layer 124 formed at the top surface of substrate 102 and a second gate 126 formed over the second gate dielectric layer 124. The second gate dielectric layer 124 and the second gate 126 may be sacrificial elements or permanent elements of the NMOS transistor 106. The second gate dielectric layer 124 and the second gate 126 may be formed concurrently with the first gate dielectric layer 110 and the first gate 112 of the PMOS transistor 104. The gate hard mask material 114 may possibly be present over the second gate 126. The NMOS transistor 106 also includes n-type lightly doped drain (NLDD) regions 128 formed in the substrate 102 adjacent to, and underlapping, the second gate 126. The NMOS transistor 106 further includes second S/D spacers 130 on lateral surfaces of the second gate 126. The second S/D spacers 130 may include, for example, a first spacer layer 132 of silicon dioxide and a second spacer layer 134 of silicon nitride. Other configurations of the second S/D spacers 130 are within the scope of the instant example. At least a portion of the second S/D spacers 130 are formed after the NLDD regions 128. At least a portion of the second S/D spacers 130, for example the second spacer layer 134, may be formed concurrently with corresponding elements of the first S/D spacers 118 of the PMOS transistor 104.

A layer of $Si_xBN$ 136 is formed over the PMOS transistor 104 and the NMOS transistor 106. The layer of $Si_xBN$ 136 includes 1 atomic percent silicon to 30 atomic percent silicon, and is 10 nanometers to 80 nanometers thick. In one version of the instant example, the layer of $Si_xBN$ 136 includes 4 atomic percent silicon to 16 atomic percent silicon. The layer of $Si_xBN$ 136 may be substantially amorphous, or may have some fraction of microcrystalline structure.

The layer of $Si_xBN$ 136 may be formed, in one example, using a plasma enhanced chemical vapor deposition (PECVD) process with diborane ($B_2H_6$), silane ($SiH_4$) and ammonia ($NH_3$) in a carrier gas at 330° C. to 450° C. and 1 to 10 torr with an RF power density of 1 W/cm$^2$ to 3 W/cm$^2$. A ratio of a flow rate of the silane to a flow rate of the diborane may be 1:30 to 1:2, depending on a desired concentration of silicon in the layer of $Si_xBN$ 136. A PECVD process may advantageously provide a low stress layer at lower temperature compared to other processes.

The layer of $Si_xBN$ 136 may be formed, in another example, using an atomic layer deposition (ALD) process with boron trichloride ($BCl_3$), dichlorosilane ($SiH_2Cl_2$) and ammonia at 600° C. to 650° C. An ALD process may advantageously provide a more conformal layer compared to a PECVD process. Other processes to form the layer of $Si_xBN$ 136, such as metal organic chemical vapor deposition (MOCVD) are within the scope of the instant example.

An optional layer of etch mask material 138 may be formed over the layer of $Si_xBN$ 136. The layer of etch mask material 138 may include, for example, silicon dioxide formed by a PECVD process using silane and oxygen, or using tetraethyl orthosilicate, also known as tetraethoxysilane or TEOS, amorphous carbon formed by a PECVD process using an aliphatic hydrocarbon, titanium formed by sputtering and/or titanium nitride formed by reactive sputtering of titanium in a nitrogen-containing ambient or ALD. The layer of etch mask material 138 may be, for example, twice as thick as the layer of $Si_xBN$ 136.

A photoresist mask 140 is formed over the layer of etch mask material 138 and patterned using a photolithographic process so as to expose the PMOS transistor 104 and cover the NMOS transistor 106. The photoresist mask 140 may be formed, for example, using positive tone i-line photoresist or amplified 193-nanometer photoresist.

Figure 1B:
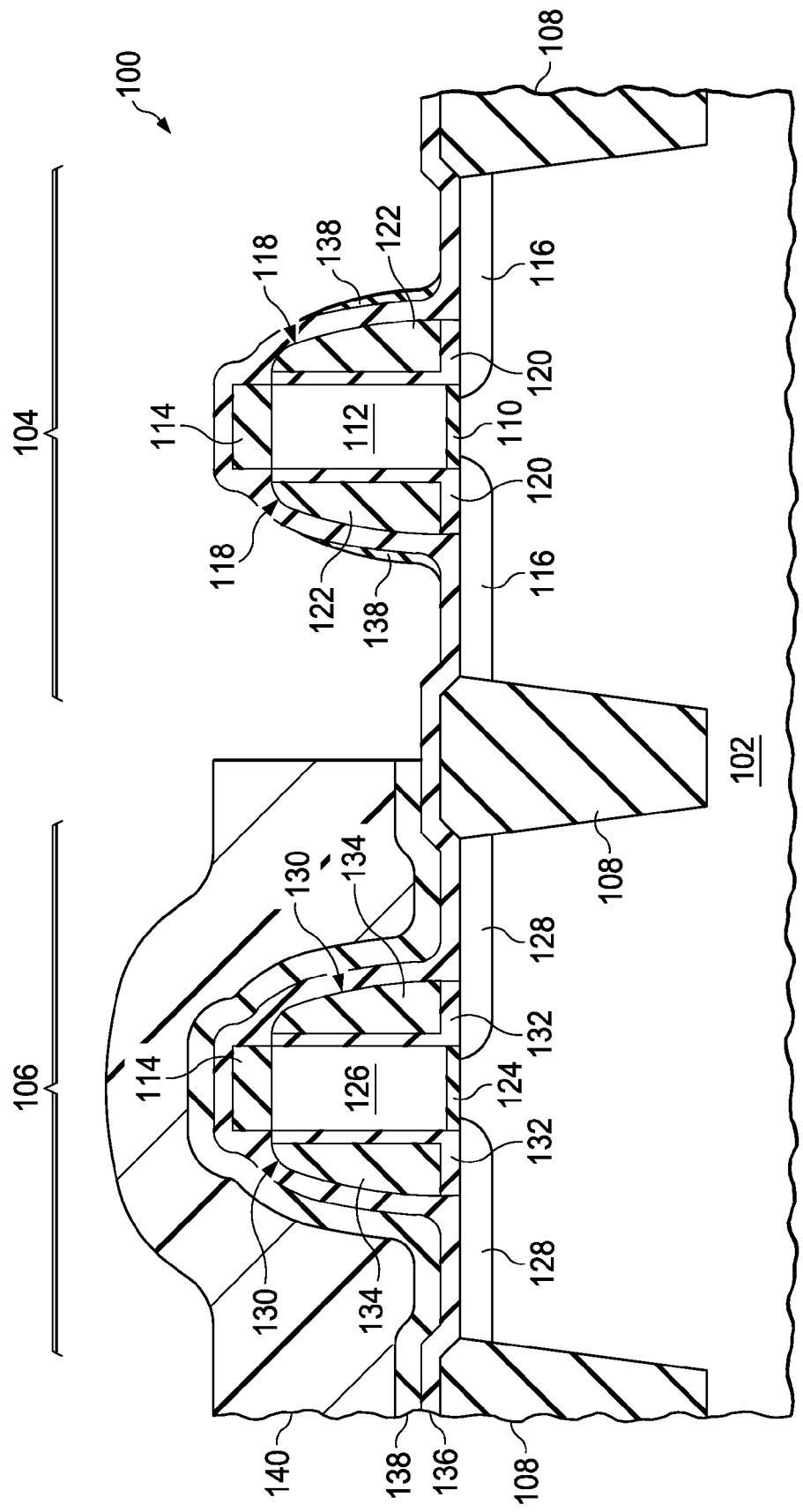

Referring to FIG. 1B, an etch process removes the layer of etch mask material 138 in areas exposed by the photoresist mask 140 thus exposing the layer of $Si_xBN$ 136 over the PMOS transistor 104 while leaving the layer of etch mask material 138 in place over the NMOS transistor 106. The etch process may depend on the material used for the layer of etch mask material 138. For example, silicon dioxide in the layer of etch mask material 138 may be removed with an RIE using fluorine or a wet etch of dilute hydrofluoric acid, possibly buffered. Removing silicon dioxide in the layer of etch mask material 138 using an RIE may leave etch mask material 138 on sides of the layer of $Si_xBN$ 136 on the PMOS transistor 104, as depicted in FIG. 1B. Amorphous carbon in the layer of etch mask material 138 may be removed by ashing. Titanium in the layer of etch mask material 138 may be removed by a wet etch of an aqueous mixture of ammonium hydroxide and hydrogen peroxide followed by a rinse followed by a wet etch of a dilute aqueous solution of hydrofluoric acid. Titanium nitride in the layer of etch mask material 138 may be removed with a wet etch of a dilute aqueous solution of hydrofluoric acid followed by a rinse followed by a wet etch of an aqueous mixture of ammonium hydroxide and hydrogen peroxide. A major portion, and possibly substantially all, of the layer of $Si_xBN$ 136 over the PMOS transistor 104 remains after the etch process is completed. The photoresist mask 140 is removed after the etch process is completed, for example by ashing or a wet etch in an aqueous mixture of sulfuric acid and hydrogen peroxide.

Figure 1C:
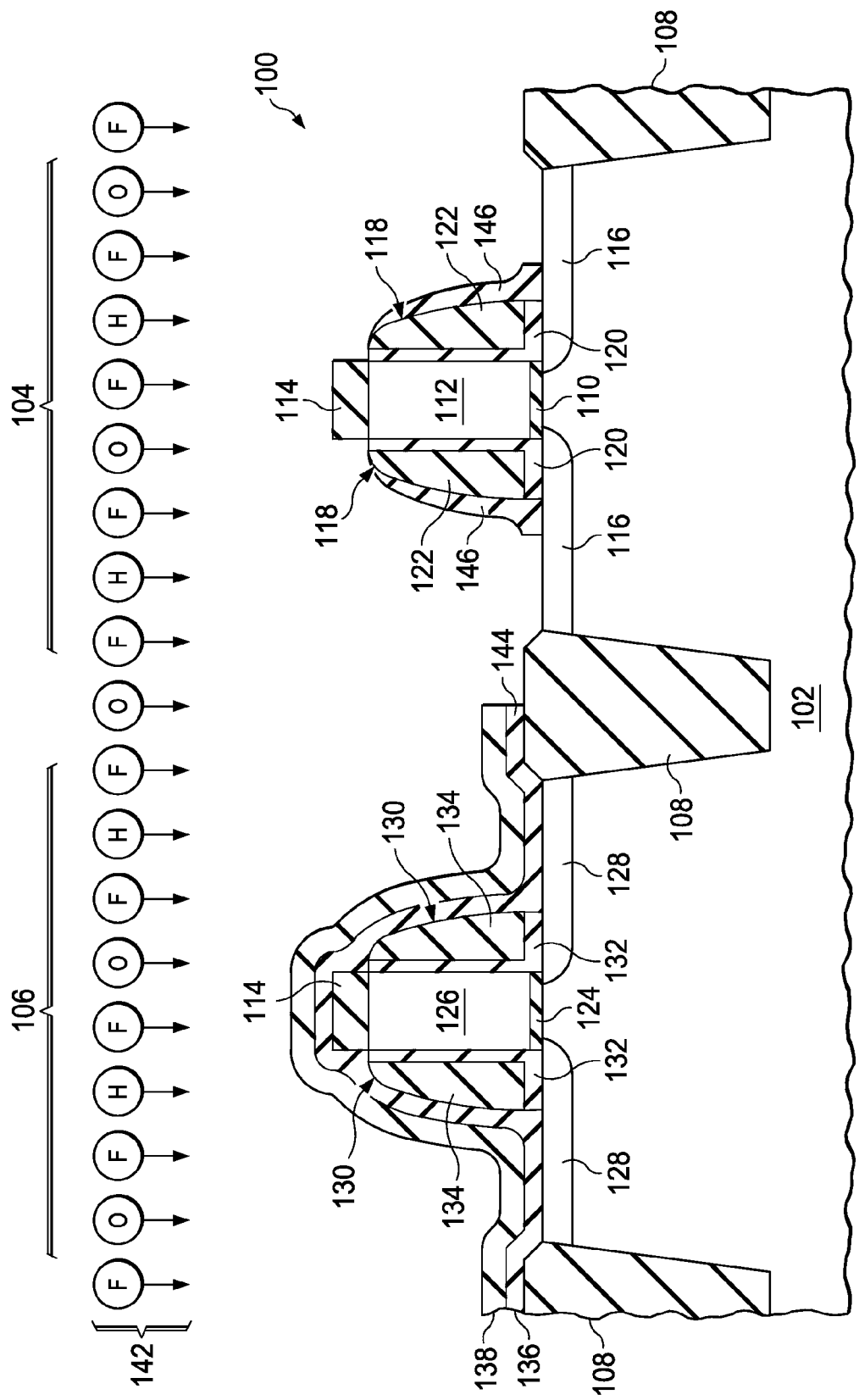

Referring to FIG. 1C, an RIE process using fluorine and oxygen or hydrogen radicals 142 removes the layer of $Si_xBN$ 136 in areas exposed by the layer of etch mask material 138, including over the PLDD regions 116 of the PMOS transistor 104 to form a hard mask 144 over the NMOS transistor 106. The RIE process leaves a portion of the layer of $Si_xBN$ 136 on the first S/D spacers 118 to form epitaxial spacers 146. Selectivity of the RIE process to silicon dioxide may be advantageously increased by increasing a flow rate of the oxygen or hydrogen, whichever is used, to a flow rate of the fluorine. Having at least 1 atomic percent silicon in the layer of $Si_xBN$ 136 provides better etch selectivity to underlying materials such as the PLDD regions 116 compared to silicon-free boron nitride.

After the RIE process is completed, the remaining layer of etch mask material 138 is removed. The removal process may depend on the material used for the layer of etch mask material 138, as described in reference to FIG. 1B.

Figure 1D:
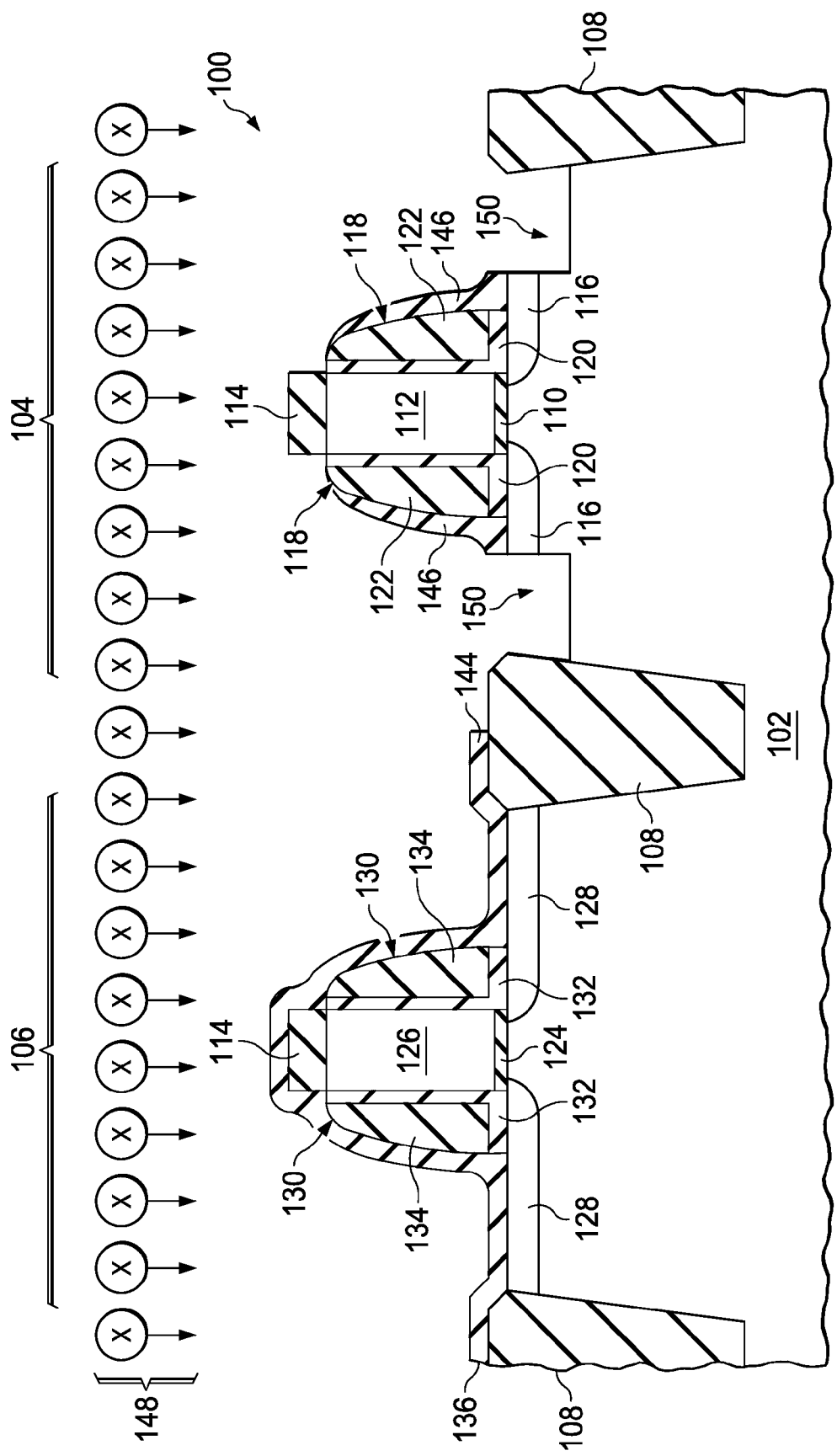

Referring to FIG. 1D, a source/drain RIE process using halogen radicals 148 removes semiconductor material from the substrate 102 in source/drain regions of the PMOS transistor 104 adjacent to the first S/D spacers 118 to form source/ drain cavities 150. The halogen radicals 148 may include fluorine, chlorine and/or bromine radicals. The hard mask 144 prevents the source/drain RIE process from removing semiconductor material from the substrate 102 in source/drain regions of the NMOS transistor 106. The source/drain RIE process does not remove more than half the epitaxial spacers 146. In one version of the instant example, the source/drain RIE process does not remove more than 3 nanometers of the epitaxial spacers 146.

Figure 1E:
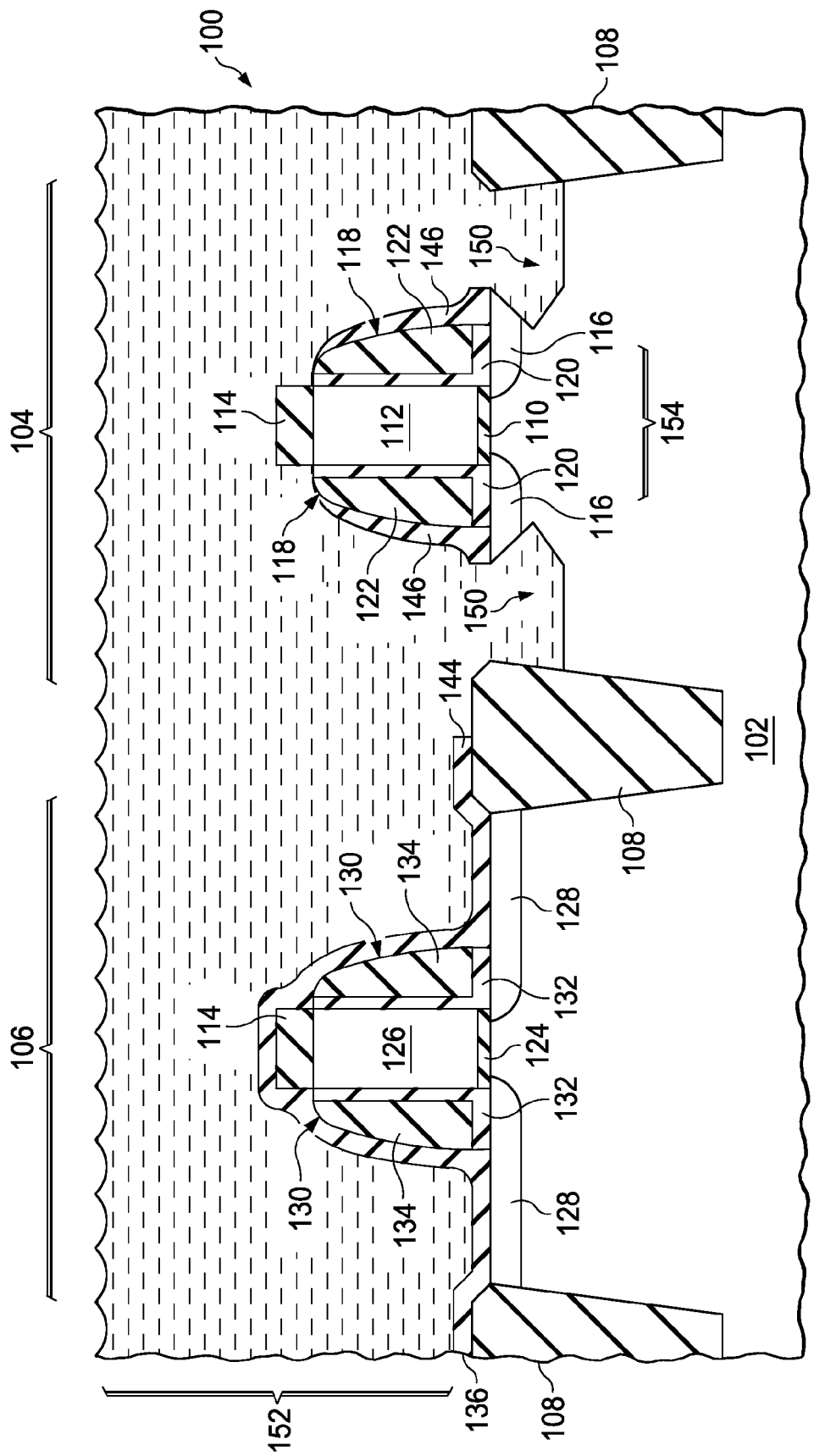

Referring to FIG. 1E, a source/drain crystallographic etch process using an alkaline solution 152 removes more semiconductor material from the substrate at the source/drain cavities 150, for example, along <111> crystallographic planes so that the source/drain cavities 150 have corners under the PLDD regions 116. The source/drain crystallographic etch process may include tetramethyl ammonium hydroxide (TMAH) or ammonium hydroxide. Forming the epitaxial spacers 146 of $Si_xBN$ may advantageously reduce erosion of the epitaxial spacers 146 during the source/drain crystallographic etch process compared to epitaxial spacers of other materials, and thus provide more consistent spacing 154 between the source/drain cavities 150 under the PLDD regions 116.

Figure 1F:
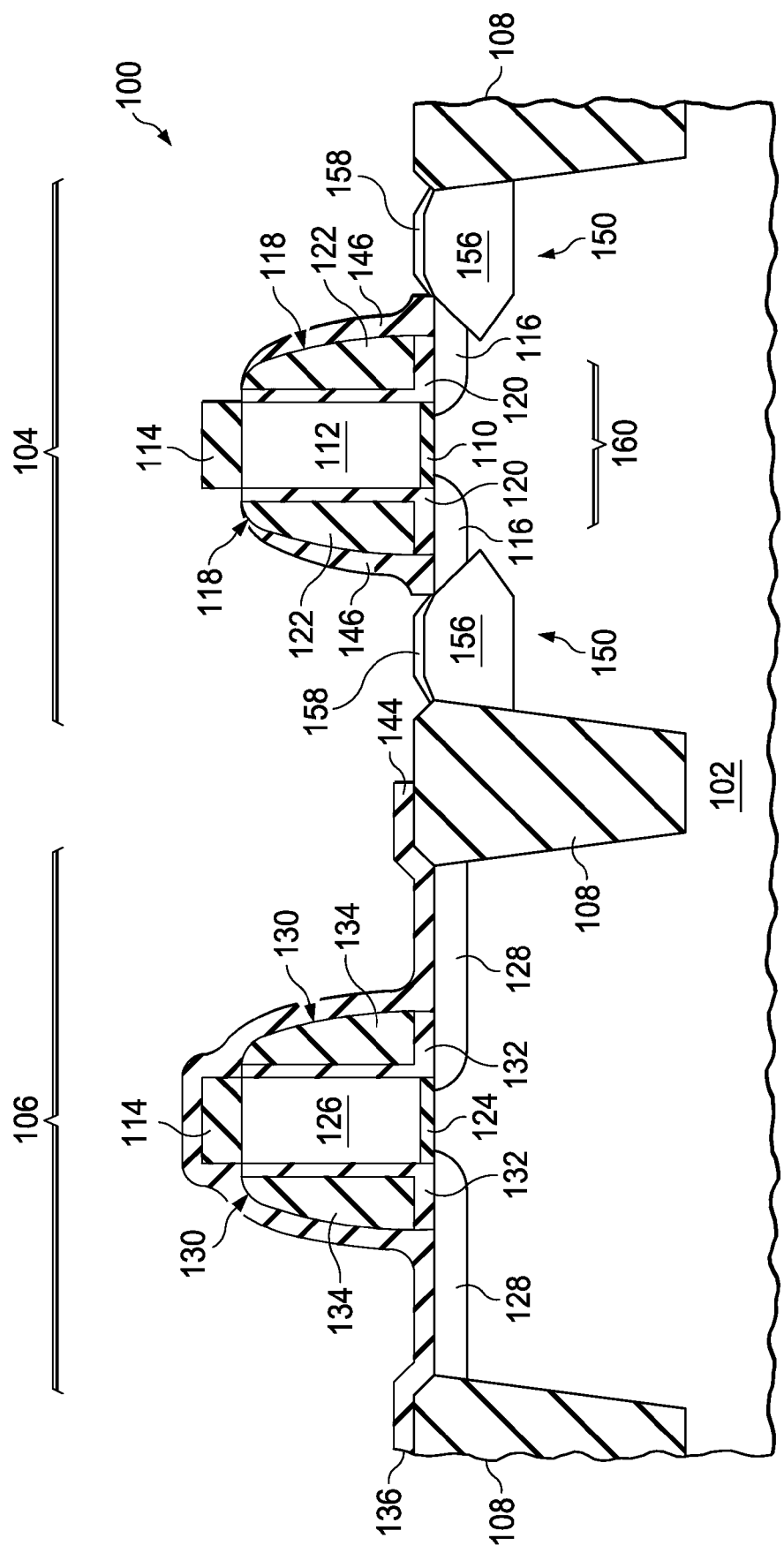

Referring to FIG. 1F, source/drain epitaxial regions 156 of semiconductor material are formed in the source/drain cavities 150 using an epitaxial growth process. The source/drain epitaxial regions 156 may be silicon germanium (SiGe) with 10 percent to 30 percent germanium, so as to provide compressive stress in a channel region of the PMOS transistor 104. Optional silicon epitaxial caps 158 may be formed over the source/drain epitaxial regions 156 to provide etch stop layers for subsequent process steps. The hard mask 144 prevents semiconductor material from being formed on the substrate 102 in source/drain regions of the NMOS transistor 106 during the epitaxial growth process. Having less than 30 atomic percent silicon in the hard mask 144 desirably inhibits epitaxial growth of the semiconductor material on the hard mask 144. Forming the epitaxial spacers 146 of $Si_xBN$ to provide consistent spacing 154 between the source/drain cavities 150 as described in reference to FIG. 1E may thus provide more consistent spacing 160 between the source/drain epitaxial regions 156 and thus advantageously provide more consistent compressive stress in the channel region of the PMOS transistor 104.

Figure 1G:
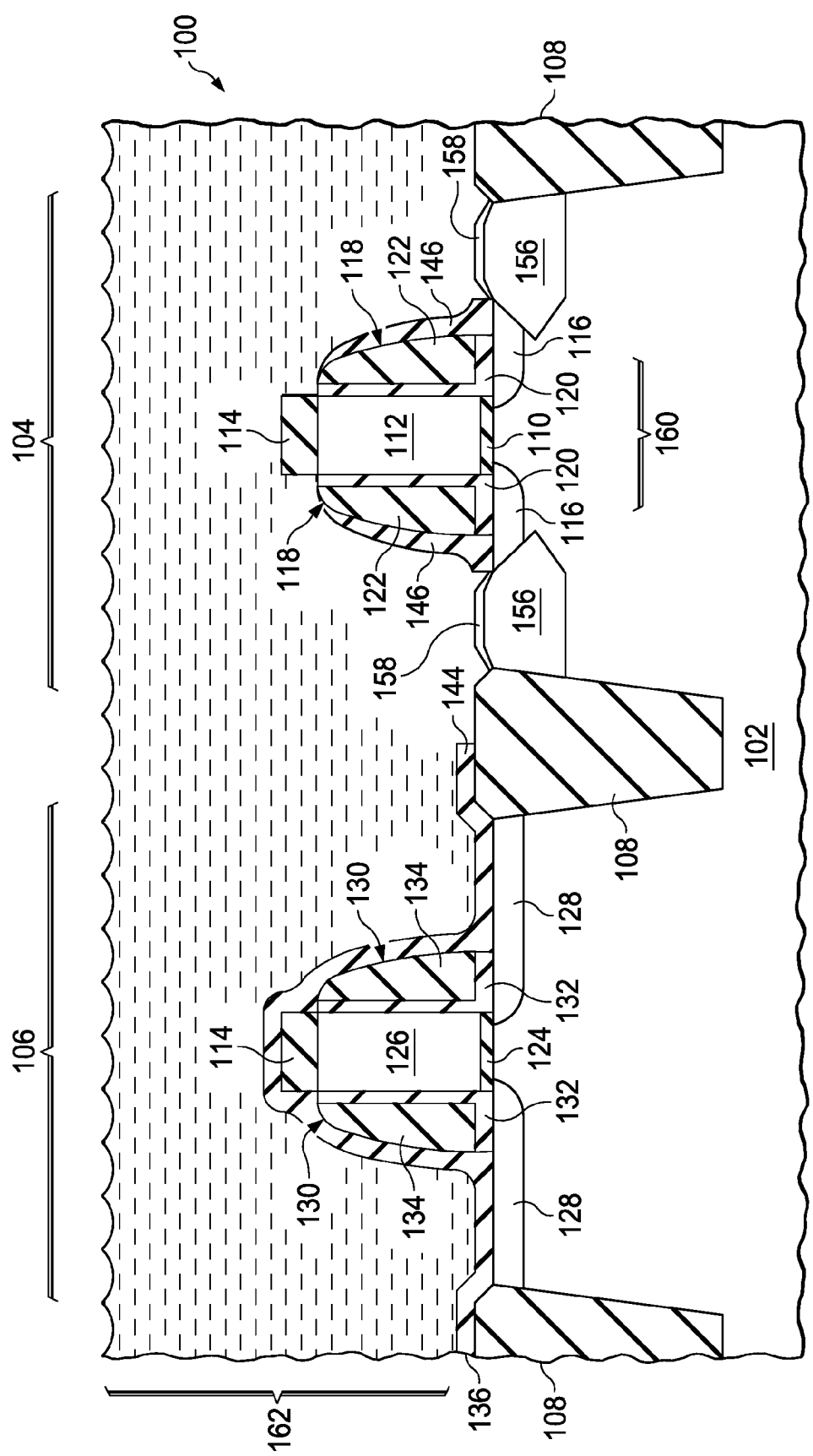

Referring to FIG. 1G, the remaining $Si_xBN$ of the hard mask 144 and the epitaxial spacers 146 is removed, for example using a wet etch of phosphoric acid 162 at 120° C. to 180° C. In one version of the instant example, the remaining $Si_xBN$ of the hard mask 144 and the epitaxial spacers 146 may be removed using the wet etch of phosphoric acid 162 at 155° C. to 165° C. Exposure of the integrated circuit 100 to the wet etch 162 may be timed so as to limit degradation of the first S/D spacers 118 and second S/D spacers 130. The silicon epitaxial caps 158 may advantageously prevent degradation of the source/drain epitaxial regions 156 from the wet etch 162.

Figure 1H:
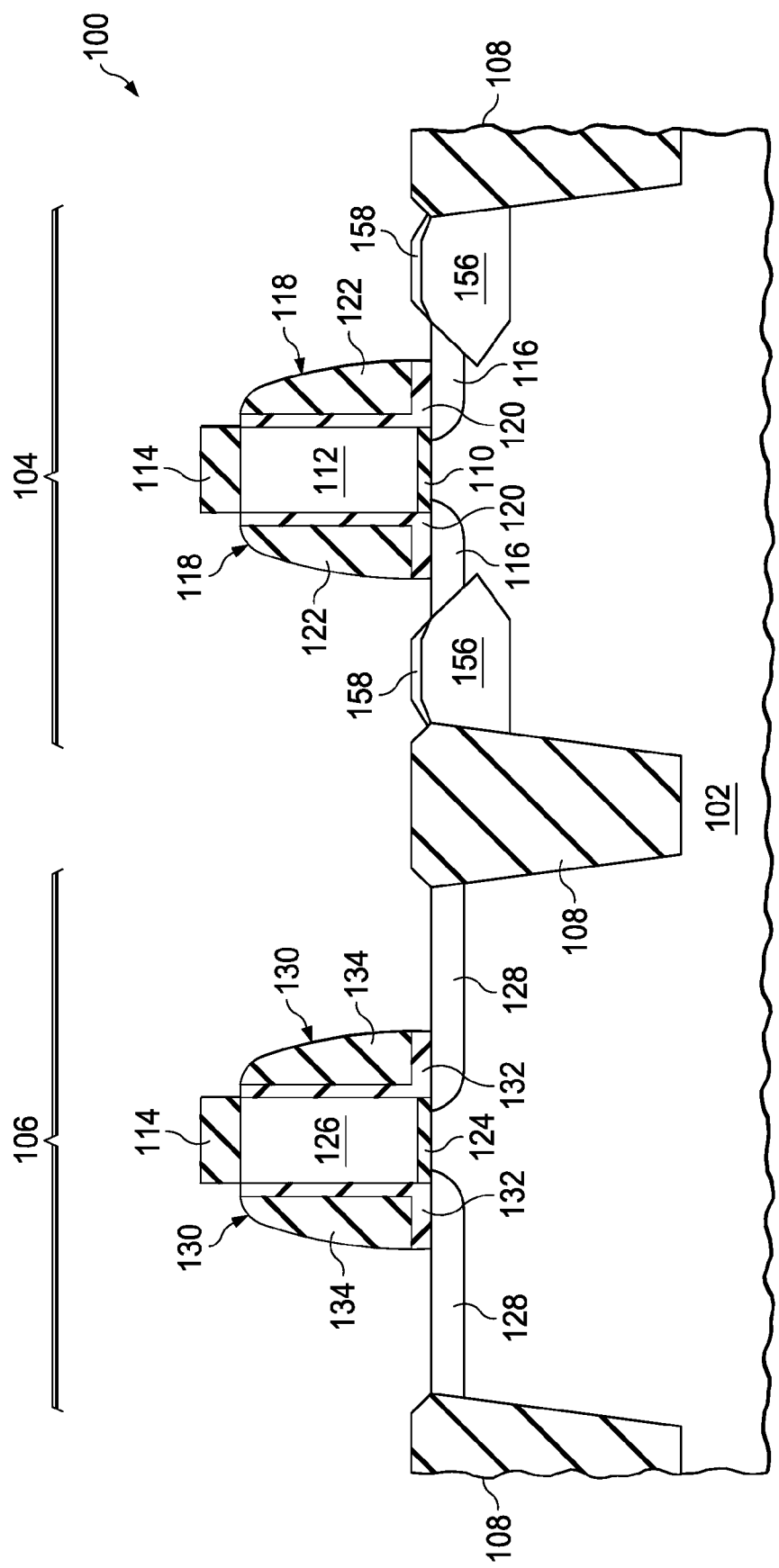

FIG. 1H depicts the integrated circuit 100 after the $Si_xBN$ of the hard mask 144 and the epitaxial spacers 146 of FIG. 1G is removed.

Figure 2A:
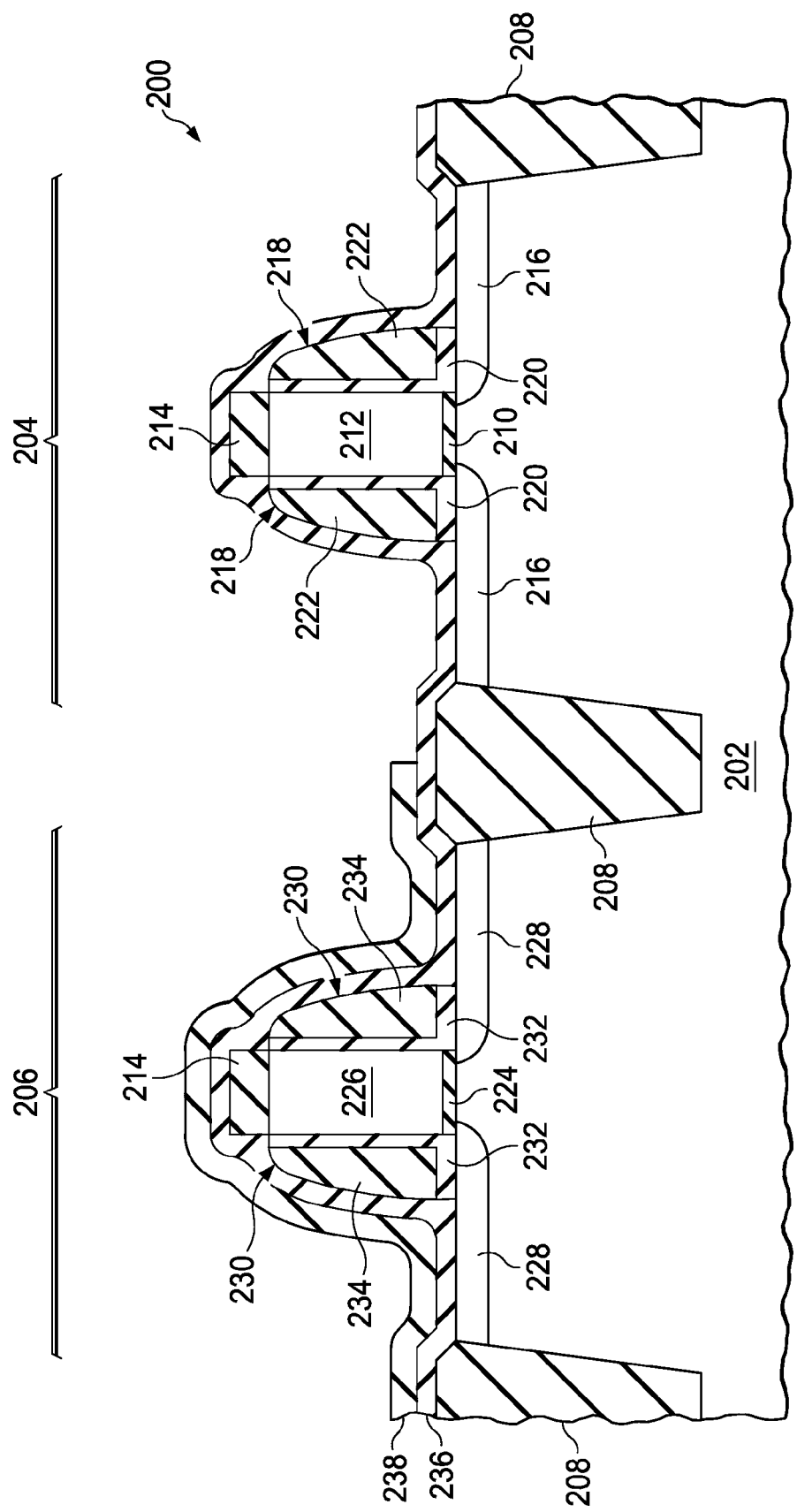
FIG. 2A through FIG. 2D are cross sections of an integrated circuit, depicted in successive stages of another exemplary fabrication sequence.

FIG. 2A through FIG. 2D are cross sections of an integrated circuit, depicted in successive stages of another exemplary fabrication sequence. Referring to FIG. 2A, the integrated circuit 200 is formed in and on a substrate 202 which includes semiconductor material, as described in reference to FIG. 1A. The integrated circuit 200 includes an area for a first polarity MOS transistor 204 which in the instant example is a PMOS transistor 204, and a second, opposite polarity MOS transistor 206 which in the instant example is an NMOS transistor 206. The PMOS transistor 204 and the NMOS transistor 206 may be laterally isolated by field oxide 208 at a top surface of the substrate 202.

The PMOS transistor 204 includes a first gate dielectric layer 210 formed at the top surface of substrate 202 and a first gate 212 formed over the first gate dielectric layer 210. Gate hard mask material 214 may possibly be present over the first gate 212. The PMOS transistor 204 also includes PLDD regions 216 formed in the substrate 202 adjacent to, and underlapping, the first gate 212. The PMOS transistor 204 further includes first S/D spacers 218 on lateral surfaces of the first gate 212, including, for example, a first spacer layer 220 of silicon dioxide and a second spacer layer 222 of silicon nitride.

Similarly, the NMOS transistor 206 includes a second gate dielectric layer 224 formed at the top surface of substrate 202 and a second gate 226 formed over the second gate dielectric layer 224. The gate hard mask material 214 may possibly be present over the second gate 226. The NMOS transistor 206 also includes NLDD regions 228 formed in the substrate 202 adjacent to, and underlapping, the second gate 226. The NMOS transistor 206 further includes second S/D spacers 230 on lateral surfaces of the second gate 226, including, for example, a first spacer layer 232 of silicon dioxide and a second spacer layer 234 of silicon nitride.

A layer of $Si_xBN$ 236 is formed over the PMOS transistor 204 and the NMOS transistor 206. In the instant example, the layer of $Si_xBN$ 236 includes 10 atomic percent silicon to 30 atomic percent silicon, and is 10 nanometers to 80 nanometers thick. In one version of the instant example, the layer of $Si_xBN$ 236 includes 4 atomic percent silicon to 16 atomic percent silicon. The layer of $Si_xBN$ 236 may be substantially amorphous, or may have some fraction of microcrystalline structure. The layer of $Si_xBN$ 236 may be formed, for example, by the processes described in reference to FIG. 1A.

A layer of etch mask material 238 is formed over the layer of $Si_xBN$ 236. The layer of etch mask material 238 may include amorphous carbon and/or silicon dioxide and may be formed as described in reference to FIG. 1A. The layer of etch mask material 238 is removed in areas over the PMOS transistor 204 while remaining in place in place over the NMOS transistor 206, as described in reference to FIG. 1B. The layer of $Si_xBN$ 236 is thus exposed over the PMOS transistor 204.

Figure 2B:
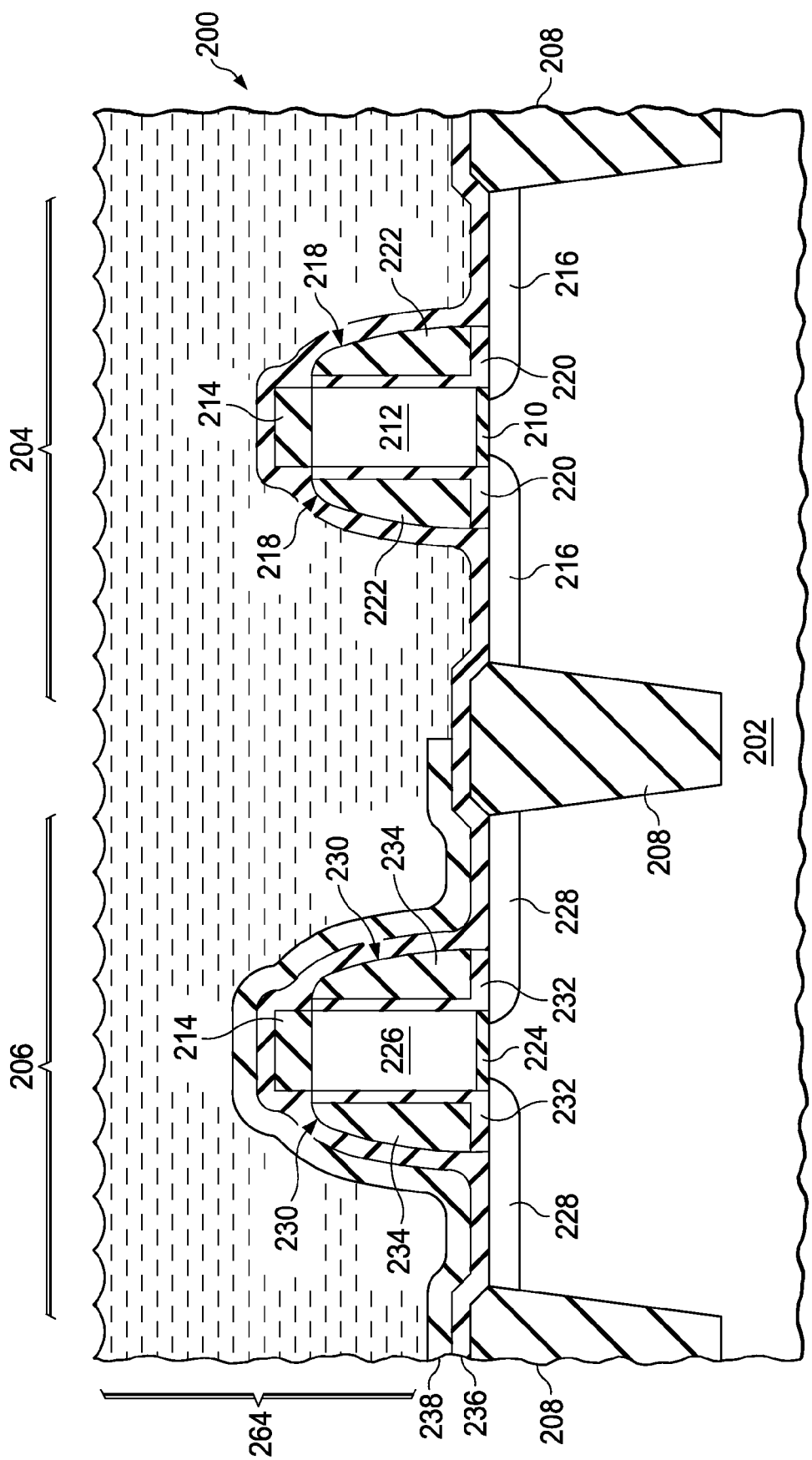

Referring to FIG. 2B, a wet etch process 264 removes all of the layer of $Si_xBN$ 236 over the PMOS transistor 204, which is exposed by the etch mask material 238. The wet etch process 264 may include, for example, a wet etch of phosphoric acid at 120° C. to 180° C. In one version of the instant example, the wet etch process 264 may include a wet etch of phosphoric acid at 155° C. to 165° C. T Having at least 1 atomic percent silicon in the layer of $Si_xBN$ 236 provides better etch selectivity to underlying materials such as the second spacer layer 222 compared to silicon-free boron nitride. The etch mask material 238 prevents removal of the layer of $Si_xBN$ 236 over the NMOS transistor 206. Forming the layer of $Si_xBN$ 236 with a higher concentration of silicon, for example over 10 atomic percent, may advantageously provide a higher etch rate of the layer of $Si_xBN$ 236 than the second spacer layer 222 of silicon nitride, so that the wet etch process 264 may be performed so as to remove an acceptably small amount of the second spacer layer 222.

Figure 2C:
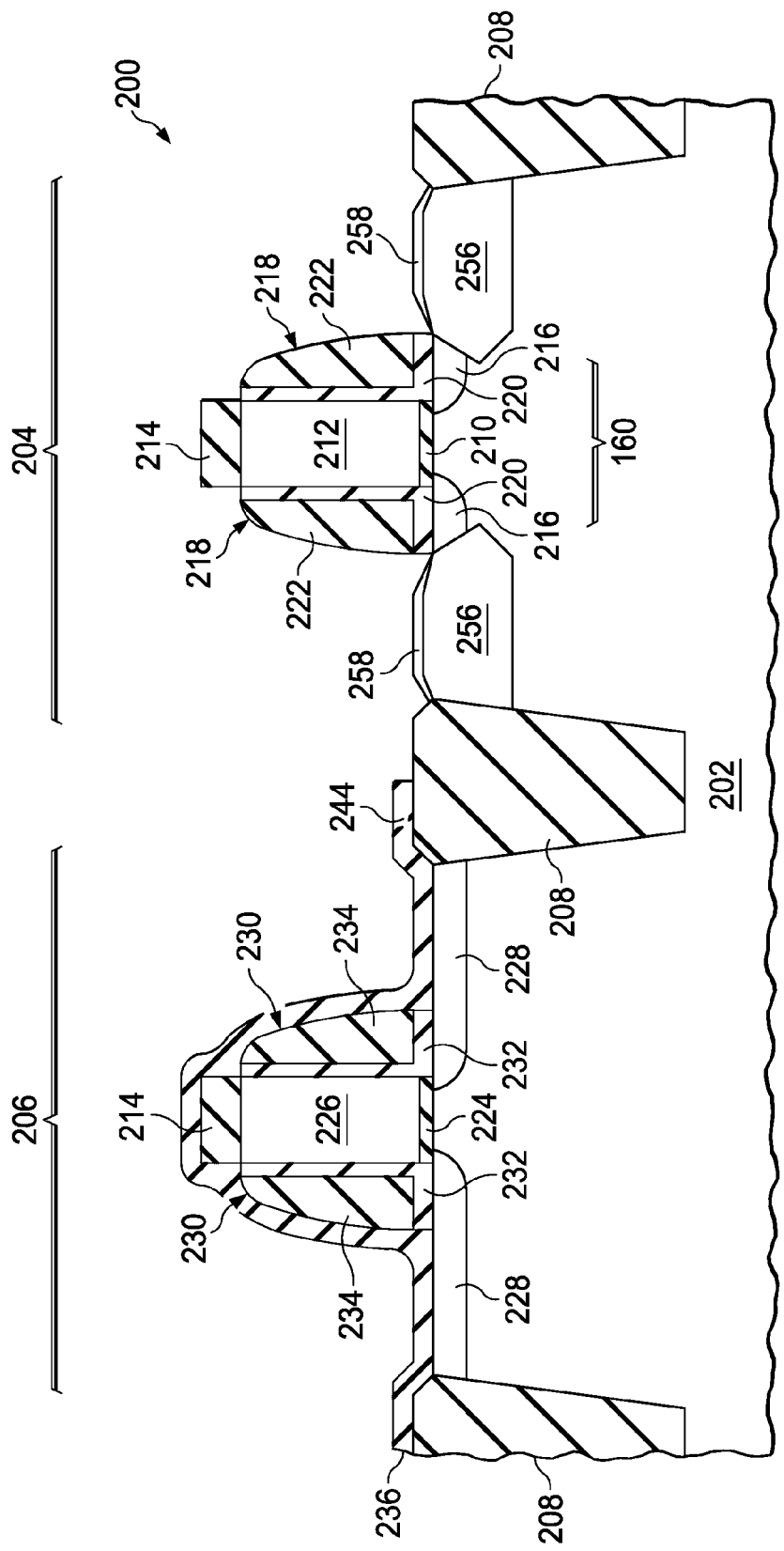

Referring to FIG. 2C, the remaining layer of etch mask material 238 is removed, as described in reference to FIG. 1C, leaving a hard mask 244 of the remaining layer of $Si_xBN$ 236 over the NMOS transistor 206. Source/drain epitaxial regions 256 of semiconductor material are formed in the substrate 202 adjacent to, and underlapping, the first S/D spacers 218, as described in reference to FIG. 1D through FIG. 1F. Optional silicon epitaxial caps 258 may be formed over the source/drain epitaxial regions 256 to provide etch stop layers for subsequent process steps. Forming the layer of $Si_xBN$ 236 with a higher concentration of silicon so as to remove an acceptably small amount of the second spacer layer 222 in the wet etch process 264 of FIG. 2B may advantageously provide more consistent spacing 260 between the source/drain epitaxial regions 256 and thus advantageously provide more consistent compressive stress in the channel region of the PMOS transistor 204.

Figure 2D:
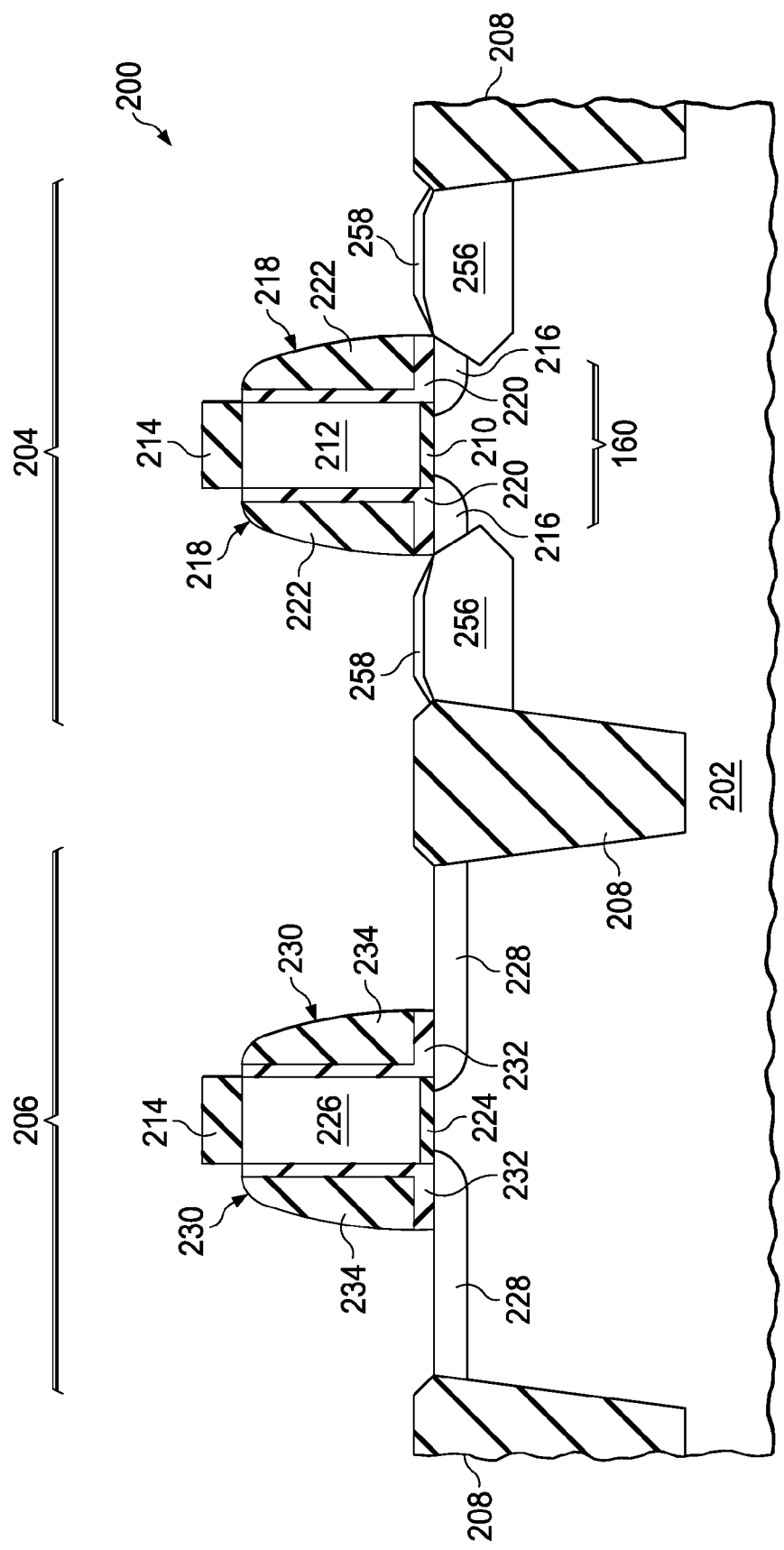

Referring to FIG. 2D, the remaining $Si_xBN$ of the hard mask 244 is removed using a wet etch of phosphoric acid 262 at 120° C. to 180° C. In one version of the instant example, the wet etch of phosphoric acid 262 may be at 155° C. to 165° C. The silicon epitaxial caps 258 may advantageously prevent degradation of the source/drain epitaxial regions 256 from the wet etch 262.

Figure 3A:
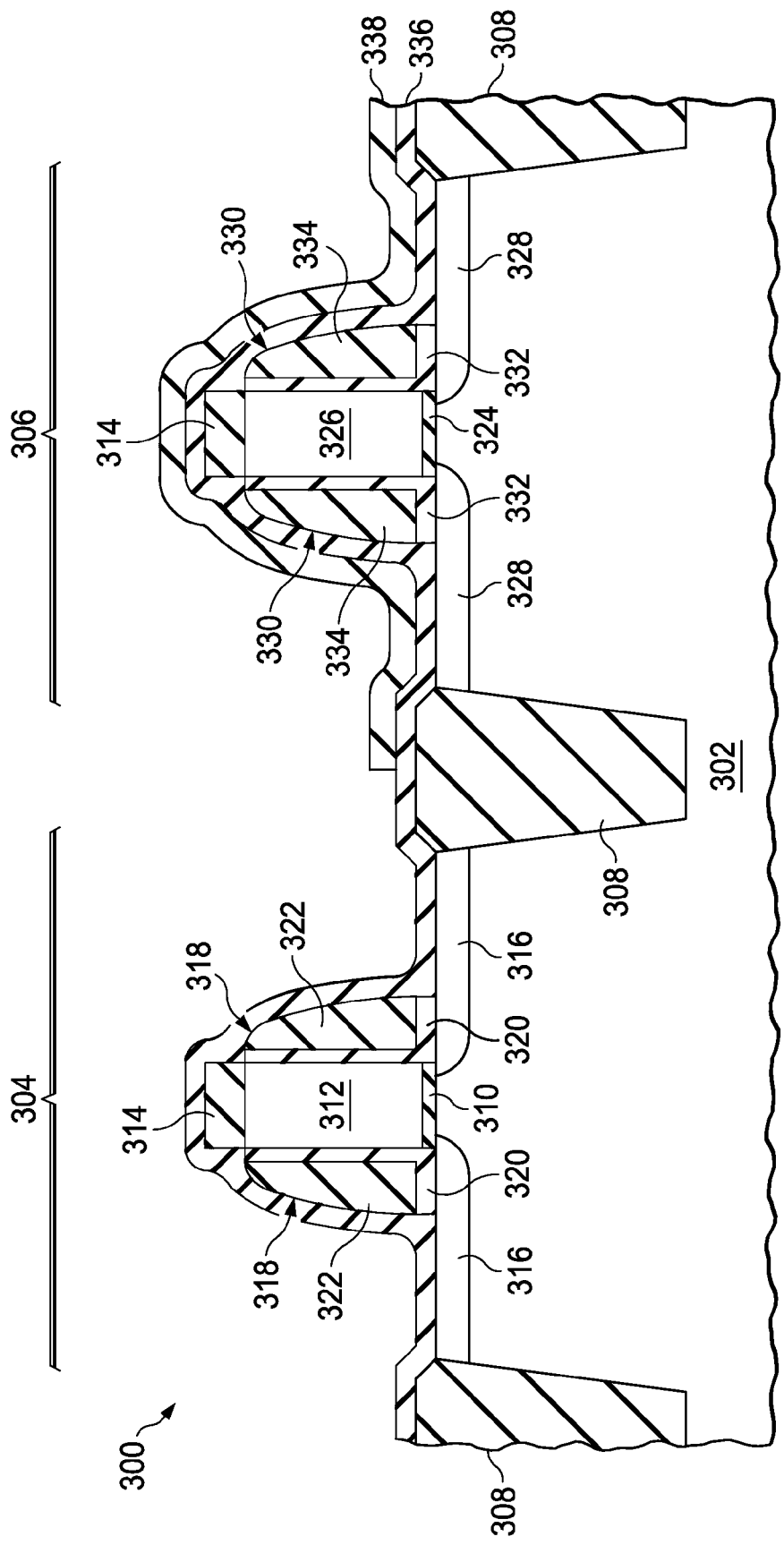
FIG. 3A through FIG. 3F are cross sections of an integrated circuit, depicted in successive stages of a further exemplary fabrication sequence.

FIG. 3A through FIG. 3F are cross sections of an integrated circuit, depicted in successive stages of a further exemplary fabrication sequence. Referring to FIG. 3A, the integrated circuit 300 is formed in and on a substrate 302 which includes semiconductor material, as described in reference to FIG. 1A. The integrated circuit 300 includes an area for a first polarity MOS transistor 304 which in the instant example is an NMOS transistor 304, and a second, opposite polarity MOS transistor 306 which in the instant example is a PMOS transistor 306. The PMOS transistor 306 and the NMOS transistor 304 may be laterally isolated by field oxide 308 at a top surface of the substrate 302.

The NMOS transistor 304 includes a first gate dielectric layer 310 formed at the top surface of substrate 302 and a first gate 312 formed over the first gate dielectric layer 310. Gate hard mask material 314 may possibly be present over the first gate 312. The NMOS transistor 304 also includes NLDD regions 316 formed in the substrate 302 adjacent to, and underlapping, the first gate 312. The NMOS transistor 304 further includes first S/D spacers 318 on lateral surfaces of the first gate 312, including, for example, a first spacer layer 320 of silicon dioxide and a second spacer layer 322 of silicon nitride.

Similarly, the PMOS transistor 306 includes a second gate dielectric layer 324 formed at the top surface of substrate 302 and a second gate 326 formed over the second gate dielectric layer 324. The gate hard mask material 314 may possibly be present over the second gate 326. The PMOS transistor 306 also includes PLDD regions 328 formed in the substrate 302 adjacent to, and underlapping, the second gate 326. The PMOS transistor 306 further includes second S/D spacers 330 on lateral surfaces of the second gate 326, including, for example, a first spacer layer 332 of silicon dioxide and a second spacer layer 334 of silicon nitride.

A layer of $Si_xBN$ 336 is formed over the PMOS transistor 306 and the NMOS transistor 304. The layer of $Si_xBN$ 336 includes 1 atomic percent silicon to 30 atomic percent silicon, and is 10 nanometers to 80 nanometers thick. In one version of the instant example, the layer of $Si_xBN$ 336 includes 4 atomic percent silicon to 16 atomic percent silicon. The layer of $Si_xBN$ 336 may be substantially amorphous, or may have some fraction of microcrystalline structure. The layer of $Si_xBN$ 336 may be formed, for example, by the processes described in reference to FIG. 1A.

A layer of etch mask material 338 is formed over the layer of $Si_xBN$ 336. The layer of etch mask material 338 may be formed as described in reference to FIG. 1A. The layer of etch mask material 338 is removed in areas over the NMOS transistor 304 while remaining in place in place over the PMOS transistor 306, in a similar manner as described in reference to FIG. 1B. The layer of $Si_xBN$ 336 is thus exposed over the NMOS transistor 304.

Figure 3B:
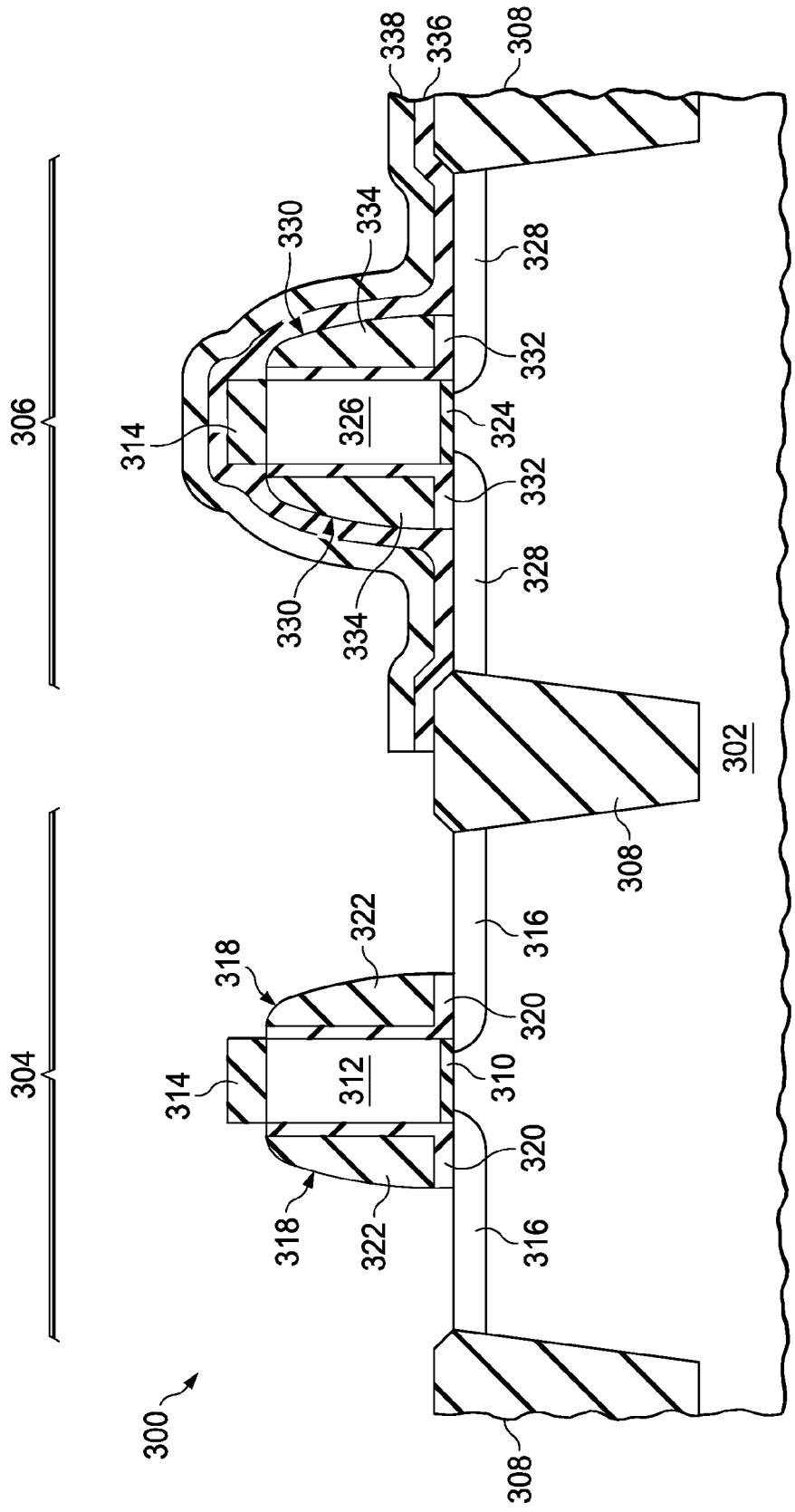

Referring to FIG. 3B, the layer of $Si_xBN$ 336 over the NMOS transistor 304, which is exposed by the etch mask material 338, is removed. The removal process may be an RIE process as described in reference to FIG. 1C, which optionally leaves epitaxial spacers, not shown, on the second S/D spacers 330. Alternatively, the removal process may be a wet etch process as described in reference to FIG. 2B which removes all of the layer of $Si_xBN$ 336 from over the NMOS transistor 304.

Figure 3C:
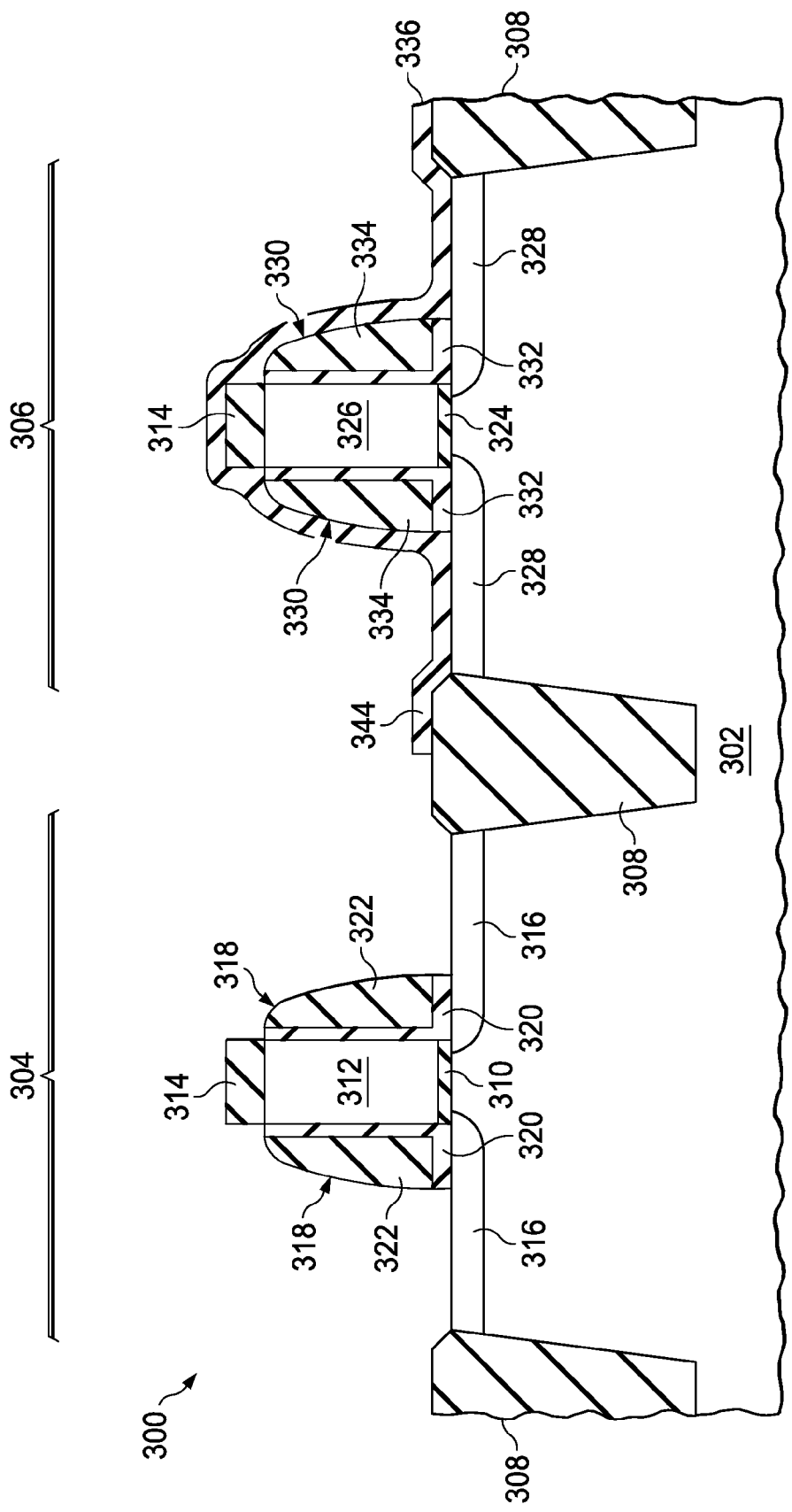

Referring to FIG. 3C, the remaining layer of etch mask material 338 is removed, as described in reference to FIG. 1C, leaving a hard mask 344 of the remaining layer of $Si_xBN$ 336 over the PMOS transistor 306. The substrate 302 adjacent to the second S/D spacers 330 is exposed after the etch mask material 338 is removed.

Figure 3D:
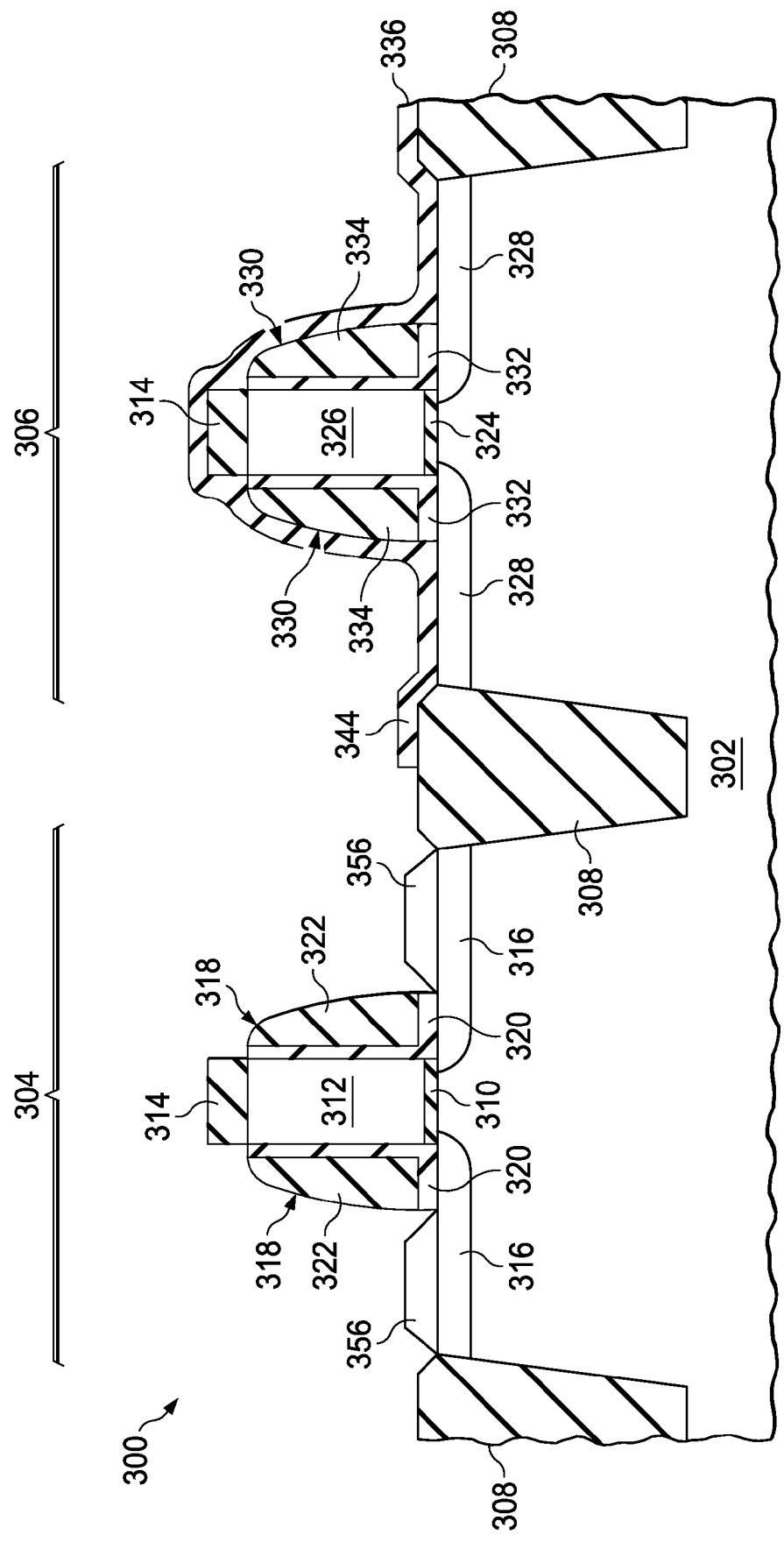

Referring to FIG. 3D, source/drain epitaxial regions 356 of semiconductor material are formed on the substrate 302 adjacent to the second S/D spacers 330. The source/drain epitaxial regions 356 may be silicon carbide so as to provide tensile stress in a channel region of the NMOS transistor 304. The hard mask 344 prevents semiconductor material from being formed on the substrate 302 in source/drain regions of the PMOS transistor 306 while the source/drain epitaxial regions 356 are formed.

Figure 3E:
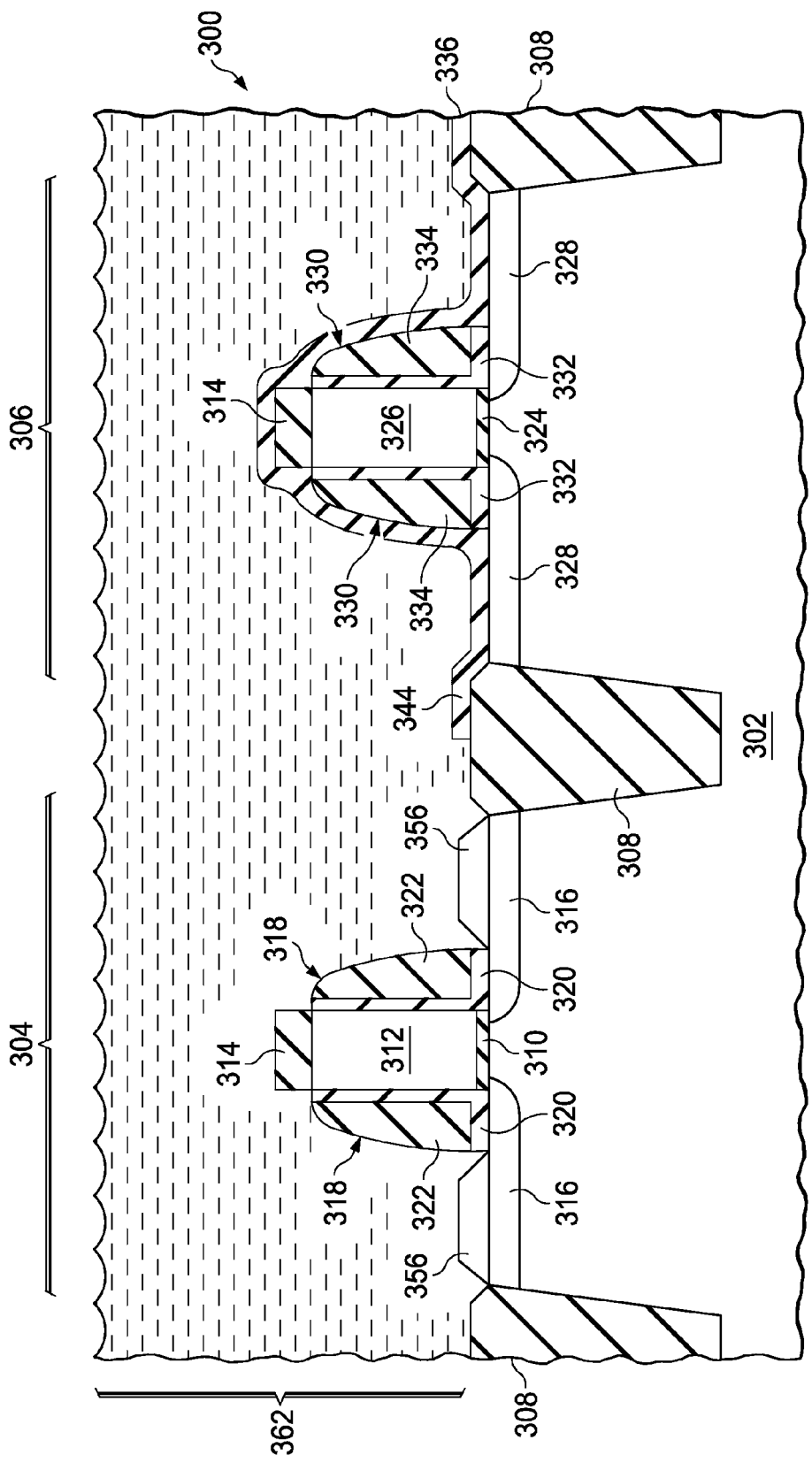

Referring to FIG. 3E, the remaining $Si_xBN$ of the hard mask 344 is removed using a wet etch of phosphoric acid 362 at 120° C. to 180° C. In one version of the instant example, the wet etch of phosphoric acid 362 may be at 155° C. to 165° C. The silicon carbide in the source/drain epitaxial regions 256 may advantageously prevent degradation of from the wet etch 362.

Figure 3F:
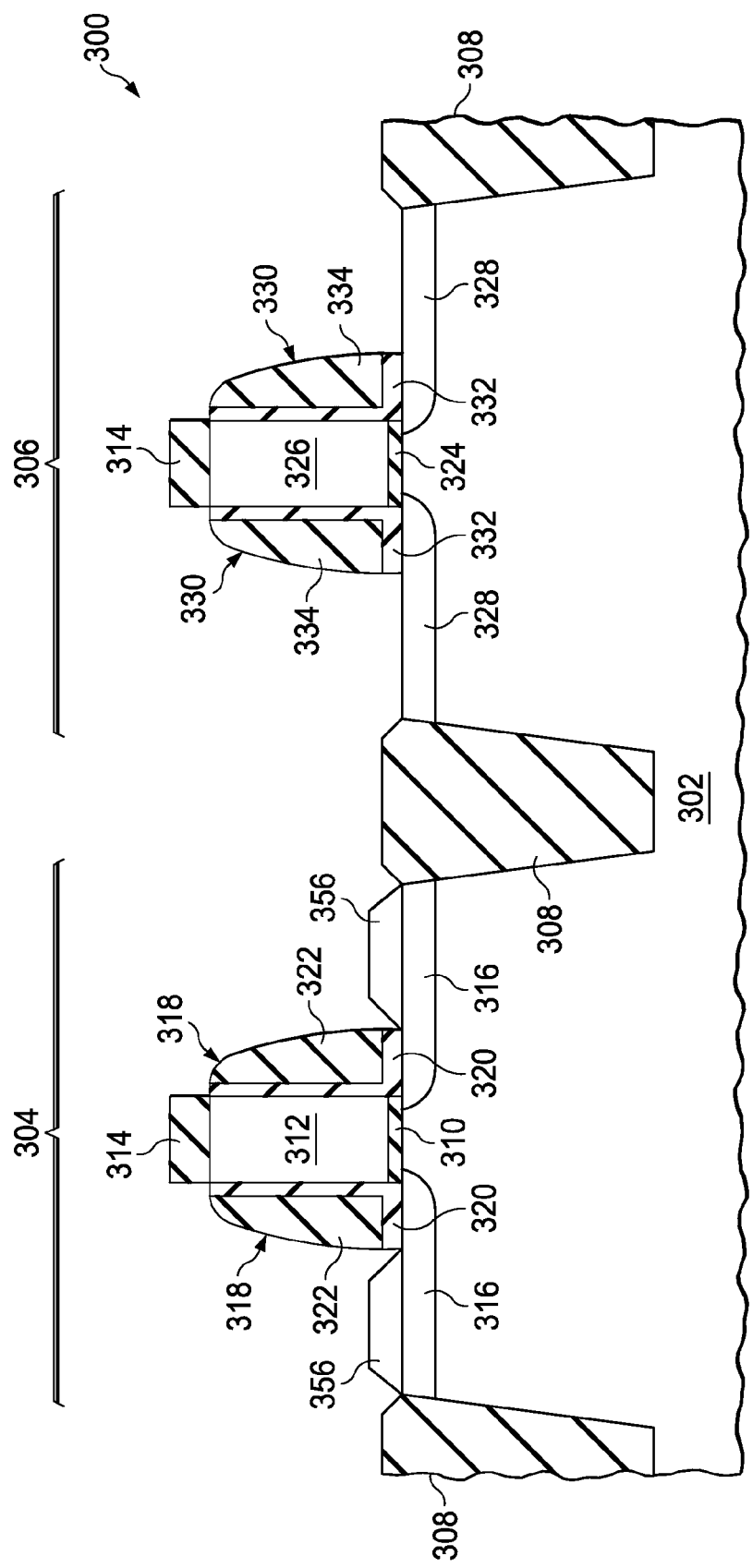

FIG. 3F depicts the integrated circuit 300 after the $Si_xBN$ of the hard mask 344 of FIG. 3E is removed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   providing a substrate comprising a semiconductor;
   forming a first metal oxide semiconductor (MOS) transistor having a first polarity on said substrate;
   forming a second MOS transistor having a second, opposite, polarity on said substrate;
   forming a layer of silicon-doped boron nitride over said first MOS transistor and said second MOS transistor, said layer of silicon-doped boron nitride having 1 atomic percent to 30 atomic percent of silicon;
   removing said layer of silicon-doped boron nitride from over said first MOS transistor; and
   forming epitaxial source and drain regions on said substrate adjacent to source/drain (S/D) spacers of said first MOS transistor using the layer of silicon-doped boron nitride as a hard mask to prevent the formation of epitaxial source and drain regions in source and drain regions of the second MOS transistor, said S/D spacers being disposed on lateral surfaces of a gate of said first MOS transistor.

2. The method of claim 1, in which said layer of silicon-doped boron nitride is formed by a plasma enhanced chemical vapor deposition (PECVD) process with diborane ($B_2H_6$), silane ($SiH_4$) and ammonia ($NH_3$) in a carrier gas at 330° C. to 450° C. and 1 to 10 torr with an RF power density of 1 $W/cm^2$ to 3 $W/cm^2$.

3. The method of claim 1, in which said layer of silicon-doped boron nitride having 4 atomic percent to 16 atomic percent of silicon.

4. The method of claim 1, in which said layer of silicon-doped boron nitride is 10 nanometers to 80 nanometers thick.

5. The method of claim 1, further including the step of removing said layer of silicon-doped boron nitride from over said second MOS transistor after said step of forming said epitaxial source and drain regions.

6. The method of claim 5, in which said step of removing said layer of silicon-doped boron nitride from over said second MOS transistor includes a wet etch of phosphoric acid at 155° C. to 165° C.

7. The method of claim 1, further including the steps of:
forming a layer of etch mask material over said layer of silicon-doped boron nitride;
forming a photoresist mask over said second MOS transistor so as to expose said layer of etch mask material over said first MOS transistor;
removing said layer of etch mask material from over said first MOS transistor exposed by said photoresist mask;
removing said photoresist mask, prior to said step of removing said layer of silicon-doped boron nitride from over said first MOS transistor; and
removing said layer of etch mask material from over said second MOS transistor after said step of removing said layer of silicon-doped boron nitride from over said first MOS transistor and before said step of forming said epitaxial source and drain regions.

8. The method of claim 7, in which said step of forming said layer of etch mask material includes forming a layer of silicon dioxide by a plasma enhanced chemical vapor deposition (PECVD) process.

9. The method of claim 8, in which said step of removing said layer of etch mask material from over said first MOS transistor includes a wet etch of dilute hydrofluoric acid.

10. The method of claim 7, in which said step of forming said layer of etch mask material includes forming a layer of amorphous carbon by a PECVD process using an aliphatic hydrocarbon.

11. The method of claim 10, in which said step of removing said layer of etch mask material from over said first MOS transistor includes ashing.

12. The method of claim 7, in which said step of forming said layer of etch mask material includes forming a layer of titanium by sputtering.

13. The method of claim 7, in which said step of forming said layer of etch mask material includes forming a layer of titanium nitride by reactive sputtering of titanium in a nitrogen-containing ambient.

14. The method of claim 1, in which said step of removing said layer of silicon-doped boron nitride from over said first MOS transistor includes a reactive ion etch (RIE) process which leaves a portion of said layer of silicon-doped boron nitride on said S/D spacers so as to form epitaxial spacers.

15. The method of claim 1, in which said step of removing said layer of silicon-doped boron nitride from over said first MOS transistor includes a wet etch which removes all of said layer of silicon-doped boron nitride over said first MOS transistor.

16. The method of claim 1, in which:
said first MOS transistor is a p-channel metal oxide semiconductor (PMOS) transistor;
said second MOS transistor is an n-channel metal oxide semiconductor (NMOS) transistor; and
said epitaxial source and drain regions include silicon-germanium semiconductor material.

17. The method of claim 16, further comprising the steps of:
removing semiconductor material from said substrate in source/drain regions of said first MOS transistor adjacent to said S/D spacers using the layer of silicon-doped boron nitride as a hard mask, after said step of removing said layer of silicon-doped boron nitride from over said first MOS transistor; and
subsequently removing more semiconductor material from said substrate in said source/drain regions of said first MOS transistor by a source/drain crystallographic etch process using an alkaline solution using the layer of silicon-doped boron nitride as a hard mask, prior to said step of forming said epitaxial source and drain regions.

18. A method of forming an integrated circuit, comprising the steps of:
providing a substrate comprising a semiconductor;
forming a PMOS transistor and an NMOS transistor on said substrate;
forming a layer of silicon-doped boron nitride over said PMOS transistor and said NMOS transistor, said layer of silicon-doped boron nitride having 4 atomic percent to 16 atomic percent of silicon;
forming a layer of etch mask material over said layer of silicon-doped boron nitride;
forming a photoresist mask over said NMOS transistor so as to expose said layer of etch mask material over said PMOS transistor;
removing said layer of etch mask material from over said PMOS transistor exposed by said photoresist mask;
subsequently removing said photoresist mask;
removing said layer of silicon-doped boron nitride from over said PMOS transistor using an RIE process so as to leave a portion of said layer of silicon-doped boron nitride on S/D spacers disposed on lateral surfaces of a gate of said PMOS transistor so as to form epitaxial spacers while said layer of etch mask material is over said NMOS transistor;
subsequently removing said layer of etch mask material from over said NMOS transistor;
removing semiconductor material from said substrate in source/drain regions of said PMOS transistor to form source/drain cavities adjacent to said epitaxial spacers using the layer of silicon-doped boron nitride as a hard mask to protect the NMOS transistor; and
forming silicon-germanium epitaxial source and drain regions on said substrate in said source/drain cavities using the layer of silicon-doped boron nitride as a hard mask to prevent the formation of epitaxial silicon-germanium in source and drain regions of the NMOS transistor.

19. A method of forming an integrated circuit, comprising the steps of:
providing a substrate comprising a semiconductor;
forming a PMOS transistor and an NMOS transistor on said substrate;

forming a layer of silicon-doped boron nitride over said PMOS transistor and said NMOS transistor, said layer of silicon-doped boron nitride having 4 atomic percent to 16 atomic percent of silicon;

forming a layer of etch mask material over said layer of silicon-doped boron nitride;

forming a photoresist mask over said NMOS transistor so as to expose said layer of etch mask material over said PMOS transistor;

removing said layer of etch mask material from over said PMOS transistor exposed by said photoresist mask;

subsequently removing said photoresist mask;

removing said layer of silicon-doped boron nitride from over said PMOS transistor using a wet etch process so as to remove substantially all of said layer of silicon-doped boron nitride on said PMOS transistor while said layer of etch mask material is over said NMOS transistor;

subsequently removing said layer of etch mask material from over said NMOS transistor;

removing semiconductor material from said substrate in source/drain regions of said PMOS transistor to form source/drain cavities adjacent to S/D spacers disposed on lateral surfaces of a gate of said PMOS transistor using the layer of silicon-doped boron nitride as a hard mask to protect the NMOS transistor; and forming silicon-germanium epitaxial source and drain regions on said substrate in said source/drain cavities using the layer of silicon-doped boron nitride as a hard mask to prevent the formation of epitaxial silicon-germanium in source and drain regions of the NMOS transistor.

* * * * *